United States Patent [19]
Lipp

[11] Patent Number: 5,457,653
[45] Date of Patent: Oct. 10, 1995

[54] TECHNIQUE TO PREVENT DEPROGRAMMING A FLOATING GATE TRANSISTOR USED TO DIRECTLY SWITCH A LARGE ELECTRICAL SIGNAL

[75] Inventor: Robert J. Lipp, Los Gatos, Calif.

[73] Assignee: Zycad Corporation, Fremont, Calif.

[21] Appl. No.: 270,869

[22] Filed: Jul. 5, 1994

[51] Int. Cl.⁶ .................................................. G11C 11/34
[52] U.S. Cl. ................................................ 365/185.18
[58] Field of Search ........................... 365/185; 326/38; 327/407, 408, 415, 416

[56] References Cited

U.S. PATENT DOCUMENTS

| | | | |
|---|---|---|---|
| 4,870,302 | 9/1989 | Freeman | 307/465 |
| 5,015,885 | 5/1991 | Elgamal | 307/465 |

*Primary Examiner*—Joseph A. Popek
*Assistant Examiner*—A. Zarahian
*Attorney, Agent, or Firm*—Townsend and Townsend and Crew

[57] ABSTRACT

A novel method of connecting and operating an NVM transistor in the switching circuit is provided. A full voltage signal can be switched across an NVM transistor. The device is turned on prior to the signal switching and the electrical characteristics of the NVM device relative to the associated circuitry is carefully regulated to prevent the source-drain voltage from rising above a preselected maximum voltage (e.g. 1 v). Two embodiments of the present invention are described. In the first embodiment, the relative impedances of the NVM transistor and its driving circuit are controlled. The driver circuit and the NVM transistor switch act as a resistor divider circuit with a percentage of the full switching voltage appearing across the NVM transistor and the driver circuit according to their relative impedances. The second embodiment is applicable when the NVM transistor switch drives a capacitive load. The rise time of the signal to be switched is controlled. This can be done by controlling the driver circuit turn-on time, the relative resistor-capacitor (RC) risetime on either side of the NVM switch, or a combination of the two techniques. If the risetime of the switching signal is slow enough, the voltage at the output terminal of the NVM transistor closely follows the input voltage to minimize the source-drain voltage.

9 Claims, 2 Drawing Sheets

TECHNIQUE TO PREVENT DEPROGRAMMING A FLOATING GATE TRANSISTOR USED TO DIRECTLY SWITCH A LARGE ELECTRICAL SIGNAL

BACKGROUND OF THE INVENTION

The present invention is related to Field Programmable Gate Array (FPGA) integrated circuits and, more particularly, to floating gate MOS transistors used as switching elements in an FPGA.

An FPGA requires some means to programmably interconnect the FPGA. Typically, an antifuse, such as described in U.S. Pat. No. 5,015,885, which issued to A. El Gamal and S. S. Chiang on May 14, 1991, or an N-channel MOS transistor, is used as the programmable switching element used to interconnect wiring and the circuit elements of the FPGA. When an MOS transistor is used as the programmable switching element, it must be controlled by the memory bit of a programmable storage element. Most commonly, the storage element is a static RAM cell, (e.g., see U.S. Pat. No. 4,870,302, which issued to R. H. Freeman on Sep. 26, 1989). However, other storage elements can be used. For example, a patent application, U.S. Ser. No. 08/032,610, filed Mar. 17, 1993 by Richard D. Freeman, describes the use of a dynamic RAM cell as the storage element.

While combining the functions of the switching and storage elements, an antifuse switching element has the disadvantage that the antifuse is not reprogrammable. This single time programmability makes the antifuse difficult to test and unsuitable for a large class of applications where reprogrammability is required. RAM-based FPGAs are reprogrammable, but the programming is lost whenever power is turned off. A separate storage memory must be used to store the programmed pattern and the FPGA must be reprogrammed every time it is powered up. Furthermore, switching based on volatile RAM, such as static RAM and dynamic RAM cell elements, tend to occupy a large amount of space in the integrated circuit since the switch cannot be closely integrated with the memory cell.

Another type of memory cell, that of the non-volatile, reprogrammable transistor memory (NVM), have been available. NVM cells are MOS transistors with floating gates which may be charged and/or discharged by either channel hot electron (CHE) programming or Flower-Nordheim (FN) tunneling. Charging and/or discharging the floating gate provides for the non-volatile programmability features of these NVM technologies. NVM technologies have been widely used for memory and also for programmable logic devices (PLDs), where the programming and logic functions are integrated into a single cell structure. PLDs are simpler logic arrays than FPGAs with a very ordered memory-like interconnection structure, implementing programmable logic array (PLA) structures directly. On the other hand, FPGAs are typically used to implement random logic functions, a much more complex task.

The floating gate structure of these NVM cells is sensitive to hot electron injection. In fact, hot electron injection is the basis of CHE technology. One reason that NVM cells have not been used as general purpose switching elements is that the voltage across the source-drain terminals of the floating gate MOS transistor must be carefully controlled during operation to prevent inadvertent self-programming of the NVM cell by hot electron injection into the floating gate. NVM cells self-program themselves during operation if a large voltage is applied between the source and drain of the transistor while the transistors are "on". This voltage restriction has limited the use of NVM technology to memory and memory-like structure, e.g., those found in PLA or PAL logic devices, which can be addressed with a small fixed voltage and sensed with a sense amplifier.

In these devices, self-programming has been prevented by carefully biasing the NVM transistor to a "safe" condition, i.e., a state where no hot electrons are generated, during its operating, or "read" state. "Read" operation is commonly performed by clamping a small fixed voltage (e.g., 1 V) to the drain of the NVM transistor to be selected, then selecting the NVM transistor by capacitively coupling a bias voltage into its floating gate, and measuring the current through the device with a sense amplifier to determine whether the current through the transistor is above a predetermined minimum. The clamping voltage applied to the selected NVM transistor during this "read" operation limits the maximum voltage which appears across the source-drain terminals of the transistor to prevent hot electron generation.

Heretofore, it has not been believed practical to apply NVM technology to general purpose switching of full voltage signals, i.e., where the voltage to be switched is larger than the maximum voltage permitted across the source-drain terminals of the NVM transistor to avoid the possibility of inadvertent self-programming of the transistor), due to the restriction on the voltage across the source/drain terminals of an "on" NVM transistor. Without this voltage restriction, hot electrons are generated which are attracted to the floating gate and which discharge the positive voltage on the gate of the device. The NVM transistor is deprogrammed. Thus over the past 20 years since their inception in memory devices, NVM transistors have not been used as general purpose switching elements.

The present invention solves or substantially mitigates the problem of hot electron generation and the subsequent hot electron injection into the floating gate of an NVM transistor which is used to switch a full voltage signal. This permits the NVM transistor to be used as a switching element in an FPGA.

SUMMARY OF THE INVENTION

The present invention provides for a novel method of connecting and operating an NVM transistor in the switching circuit. A full voltage signal can be switched across an NVM transistor. The device is turned on prior to the signal switching and the electrical characteristics of the NVM device relative to the associated circuitry is carefully regulated to prevent the source-drain voltage from rising above a preselected maximum voltage (e.g. 1 v). Two embodiments of the present invention are described. In the first embodiment, the relative impedances of the NVM transistor and its driving circuit are controlled. The driver circuit and the NVM transistor switch act as a resistor divider circuit with a percentage of the full switching voltage appearing across the NVM transistor and the driver circuit according to their relative impedances. The second embodiment is applicable when the NVM transistor switch drives a capacitive load. The rise time of the signal to be switched is controlled. This can be done by controlling the driver circuit turn-on time, the relative resistor-capacitor (RC) risetime on either side of the NVM switch, or a combination of the two techniques. If the risetime of the switching signal is Slow enough, the voltage at the output terminal of the NVM transistor closely follows the input voltage to minimize the source-drain voltage.

DETAILED DESCRIPTION OF THE INVENTION

An NVM transistor is erased or programmed by respectively adding to or removing electrons from its floating gate. The charge on the gate becomes more positive if electrons are removed from the floating gate. The charge on the gate becomes more positive. For an N-channel NVM transistor, this action turns the transistor "on", i.e. the impedance between source and drain is reduced to permit current to flow across the source-drain terminals of the transistor. This state is commonly referred to as the "erased" state. If electrons are added, the charge on the floating gate becomes more negative. This programs the device to the "off" state. A high impedance is created between the source-drain terminals to inhibit current flow. These characteristics make the NVM transistor act like switch. When the transistor is "on", the switch is closed. When the transistor is "off", the switch is open. For P-channel NVM transistors, the characteristics are similar except the reversed polarity of the gate voltage controlling whether the transistor turns "on" or "off"

Electrons are commonly removed from the floating gate by either FN tunneling through a thin oxide layer, or by exposure to an intense radiation source, such as ultraviolet light, which stimulates the electrons to a sufficiently high energy level to escape the gate. Electrons are commonly added to the floating gate by either FN tunneling or CHE.

Figure 1:
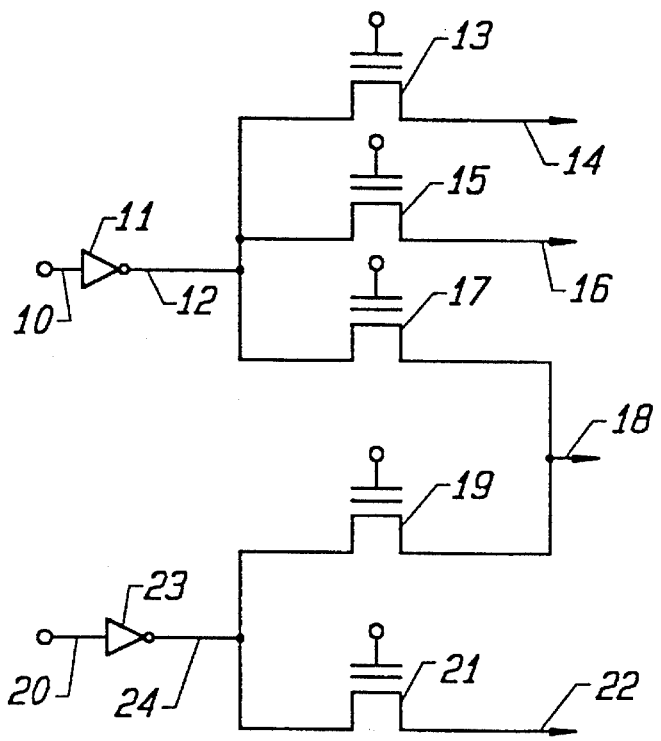
FIG. 1 is a circuit schematic showing an exemplary application of an NVM transistor as a general purpose switching element.

FIG. 1 illustrates how NVM transistors may be used as switching elements in an FPGA. An output node 12 of a buffer 11 drives the input, and therefore forms the input node, of NVM transistor switches 13, 15 and 17. The output terminals of these switches 13, 15, and 17 are connected to nodes 14, 16 and 18 respectively. -These nodes, 14, 16 and 18 are connected to other circuitry, not shown, on the integrated circuit. Similarly, an output node 24 of a buffer 23 drives the input of NVM transistor switches 19 and 21 whose outputs are connected to nodes 18 and 22, respectively. If one or more NVM switches 13, 15, and 17 are programmed "on", the signal on the buffer output node 12 propagates across these on switches to the switch output nodes 14, 16, and 18, respectively. Similarly, if either of the NVM switches 19 and 21 is programmed on, the signal on the buffer output node 24 propagates to either node 18 or 22, respectively. In this manner the programmed state of the NVM transistor switches determine the interconnection of the circuits of the FPGA and the integrated circuit is configured into a functional device as desired by the user.

For example, if it is desired for the signal from the node 24 to propagate to node 18, switch 19 is programmed "on" and switch 17 is programmed "off". This programing action is performed prior to powering up buffers 11 and 23 to prevent uncontrolled voltage swings across the NVM transistor switches. Any of these nodes 14, 16, 18, and 22 may also be connected to the output of other switches and other circuitry (not shown).

The schematic shown in FIG. 1 is for illustrative purposes only, and should not be considered as limiting the present invention. Any number of NVM transistors may be interconnected in any parallel or series arrangement to execute complex switching requirements. The buffer 11 may also be any other type of circuitry, e.g., a NAND gate, capable of delivering a signal to the input of the switches. The input nodes 10 and 20 are connected to other circuitry (not shown) on the FPGA integrated circuit.

Figure 2:
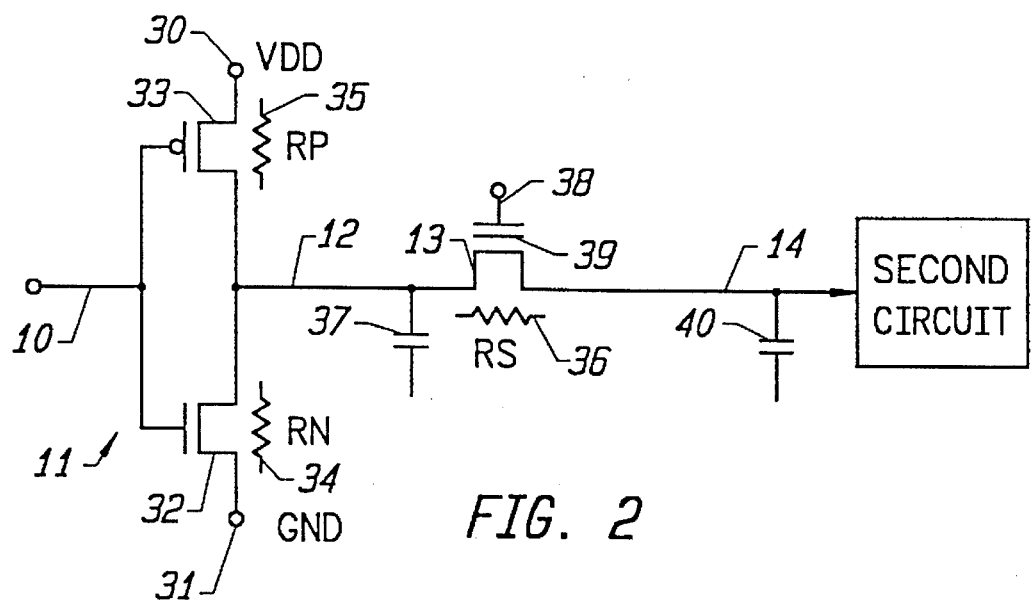
FIG. 2 is a circuit schematic illustrating the resistance and capacitance features of part of the circuit of FIG. 1.

FIG. 2 is a transistor level schematic of a portion of FIG. 1, the buffer 11 and switch 13. The buffer 11 has an NMOS transistor 32 connected between the output node 12 and ground terminal 31, and a PMOS transistor 33 connected between the output node 12 and a power supply terminal 30 at $V_{DD}$. All MOS transistors, including those shown here, have a finite on resistance. This resistance is illustrated by resistors 34, 35, and 36, each drawn next to its respective transistor 32, 33, and 13. In addition, there is a capacitive load on each node 12 and 14 which is illustrated by capacitors 37 and 40, respectively. Control terminal 38 and floating gate 39 of the NVM transistor 13 are further illustrated. The control terminal 38 is connected to other circuitry (not shown) in the integrated circuit, and is used to control programming of the NVM switch.

According to one embodiment of the present invention, a resistor divider circuit is used to ensure a reduced voltage across the NVM switch 13. If one assumes that the output node 14 is at a high voltage state near the $V_{DD}$ supply voltage, typically 5 V, and the buffer output node 12 signal switches from a high to a low voltage state (i.e., $V_{DD}$ to ground), if one further assumes that the transistor 32 turns on rapidly, and the capacitance 37 is small compared to the capacitance 40, the initial voltage on the node 12 is primarily a function of the resistance 34 of the transistor 32 as compared to the resistance 36 of the NVM switch 13. The maximum voltage $V_{MAX}$ across the NVM switch 13 is determined by the well-known resistor divider ratio formula:

$$V_{MAX} = R36/(R34+R36) * V_{DD}$$

where:

R34 is the on resistance of the transistor 32

R36 is the on resistance of the NVM transistor switch 13

$V_{DD}$ is the circuit operating voltage

For example, if $V_{DD}$=5V, R34=4 K$\Omega$, and R36=1 K$\Omega$, then $V_{MAX}$ is 1 V. In this case, 1 V is sufficiently low to ensure that no hot electrons are generated when the signal propagates across the NVM switch 13. Techniques for setting the "on" resistances of transistors are well-known to designers of integrated circuits.

Likewise, the "on" resistance 35 of the transistor 33 must be designed to result in a similar low voltage across the transistor 13 when the signal at the input node 10 switches from a low to a high voltage state. Note that there is no limitation to the total voltage swing of the signal which propagates across the switch 13 as long as the relative resistance of the driving and switching components are adjusted to limit the maximum voltage across the source-drain terminals of NVM switch 13 to the required level.

Another way of ensuring a reduced voltage across the NVM switching element is to dynamically control the voltage across the exemplary NVM switch 13 by controlling the relative charge times of the input node 12 and the output node 14 of the NVM switch. If the time to charge/discharge the node 12 is long compared to the time it takes to charge/discharge the node 14, the voltage at the node 14 remains close to that of the node 12 during the time the node 12 is switching. This limits the voltage across the NVM switch 13.

One way to accomplish this is to turn on the transistor 32 sufficiently slowly such that the node 12 discharges slowly. The node 14 then has sufficient time to discharge almost as rapidly as the node 12. This is done by driving the node 10 (and gate of the NMOS transistor 32) with a slowly rising voltage. There are many well-known ways to accomplish this function. For example, a high impedance driver can be used to drive the node 10.

Alternatively, the RC time constants of the different nodes may adjust such that the time constant at the node 14 is much faster than that of node 12. The time constants, defined by well known formulas, are set such that:

$$R34*C37 \gg R36*C.$$

where:

C37 is the capacitance 37
C40 is the capacitance 40

In such a case, the node 14 discharges almost as rapidly as the node 12. This again limits the voltage across the NVM switch 13. Likewise, the resistance 35 must be selected to maintain a similar time constant ratio during the charging of the nodes 12 and 14.

Figure 3:
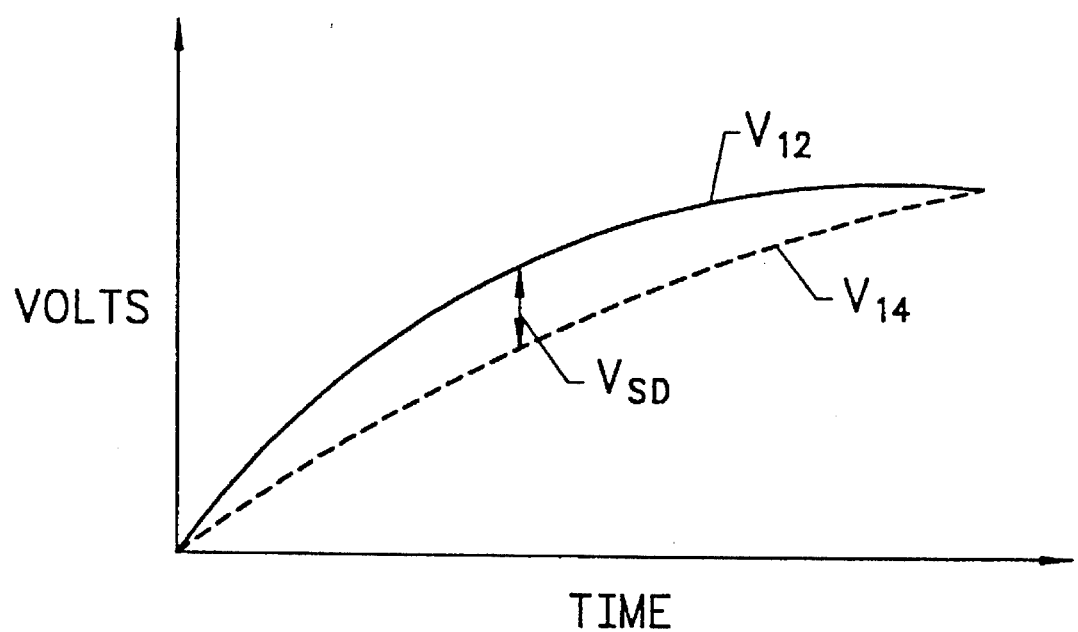
FIG. 3 is a plot of the source-drain voltages of an NVM transistor during signal switching.

FIG. 3 plots the voltage levels at the nodes 12 and 14 using this latter method. The voltage at the node 12 (V12) approximately rises with an RC time constant of R34*(C37+C40). The voltage (V14) at the node 14 is delayed from the voltage (V12) at the node 12 by approximately the time constant R36*C40. The voltage $V_{SD}$ is the difference between the two voltages and is equal to the source-drain voltage across NVM switch 13.

Techniques for determining the RC time constants of a circuit on an integrated circuit are also well-known to designers of such devices. Both the resistances and capacitances may be adjusted to achieve time constant ratios for the NVM transistor switching elements.

In practice, however, performance is still very important in an integrated circuit. Usually an integrated circuit designer attempts to minimize the delay from the node 10 to the node 14. Thus the present invention contemplates the combination of the techniques discussed above to optimize the switching characteristics. The elements of resistor divider, input risetime control and RC time constant control are combined into the final optimized circuit design.

While the above is a complete description of the preferred embodiments of the invention, various alternatives, modifications and equivalents may be used. It should be evident that the present invention is equally applicable by making appropriate modifications to the embodiments described above. Therefore, the above description should not be taken as limiting the scope of the invention which is defined by metes and bounds of the appended claims.

What is claimed is:

1. An integrated circuit comprising a plurality of switching elements, each switching element forming a programmable connection between a first circuit and a second circuit; and each switching element comprising a NVM transistor having a first source/drain terminal connected to said first circuit and a second source/drain terminal connected to said second circuit, said first circuit generating a voltage signal switching from a first logic state to a second logic state for transmission to said second circuit through said NVM transistor, said first circuit having a first characteristic resistance and said NVM transistor having a second characteristic resistance predetermined with respect to said first characteristic resistance such that a resistor divider circuit is created by said first circuit and said NVM transistor so that voltage across said first and second source/drain terminals does not exceed a predetermined amount to prevent reprogramming of said NVM transistor.

2. The integrated circuit of claim 1 wherein said first and second circuits are connected to first and second voltage supplies, said first voltage supply at a more positive voltage than said second voltage supply, and said first logic state comprises a voltage at substantially said first voltage supply and said second logic state comprises a voltage at substantially said second voltage supply.

3. The integrated circuit of claim 1 wherein said first and second circuits are connected to first and second voltage supplies, said first voltage supply at a more positive voltage than said second voltage supply, and said first logic state comprises a voltage at substantially said second voltage supply and said second logic state comprises a voltage at substantially said first voltage supply.

4. An integrated circuit comprising a plurality of switching elements, each switching element forming a programmable connection between a first circuit and a second circuit, said first and second circuits connected to first and second voltage supplies; and each switching element comprising a NVM transistor having a first source/drain terminal connected to said first circuit and a second source/drain terminal connected to said second circuit, said first circuit generating a voltage signal switching from a first logic state to a second logic state for transmission to said second circuit through said NVM transistor, said first circuit having a characteristic time of voltage switching at said first source/drain terminal of said NVM transistor such that voltage at said second source/drain terminal of the NVM transistor lags behind said first source/drain voltage by no more than a predetermined voltage magnitude to prevent reprogramming of said NVM transistor.

5. The integrated circuit of claim 4 wherein said first and second circuits are connected to said first and said second voltage supplies, said first voltage supply at a more positive voltage than said second voltage supply, and said first logic state comprises a voltage at substantially said first voltage supply and said second logic state comprises a voltage at substantially said second voltage supply.

6. The integrated circuit of claim 4 wherein said first and second circuits are connected to first and second voltage supplies, said first voltage supply at a more positive voltage than said second voltage supply, and said first logic state comprises a voltage at substantially said second voltage supply and said second logic state comprises a voltage at substantially said first voltage supply.

7. An integrated circuit comprising a plurality of switching elements, each switching element forming a programmable connection between a first circuit and a second circuit; and each switching element comprising a NVM transistor having a first source/drain terminal connected to said first circuit and a second source/drain terminal connected to said second circuit, said first circuit generating a voltage switching from a first logic state to a second logic state for transmission to said second circuit through said NVM transistor, said first circuit having a first characteristic RC time constant for a voltage swing from said first logic state to said second logic state at said first source/drain terminal of said NVM transistor, said second circuit having a second characteristic RC time constant for a voltage switch from said first logic state to said second logic state at said second source/drain terminal of said NVM transistor, said second characteristic RC time constant smaller than said first RC time constant such that voltage at said second source/drain terminal of the NVM transistor lags behind voltage at said first source/drain terminal by no more than a predetermined voltage magnitude to prevent reprogramming of said NVM transistor.

8. The integrated circuit of claim 7 wherein said first and second circuits are connected to first and second voltage supplies, said first voltage supply at a more positive voltage than said second voltage supply, and said first logic state comprises a voltage at substantially said first voltage supply and said second logic state comprises a voltage at substantially said second voltage supply.

9. The integrated circuit of claim 7 wherein said first and second circuits are connected to first and second voltage supplies, said first voltage supply at a more positive voltage than said second voltage supply, and said first logic state comprises a voltage at substantially said second voltage supply and said second logic state comprises a voltage at substantially said first voltage supply.

* * * * *